United States Patent
Eberhard

(10) Patent No.: US 11,990,576 B2
(45) Date of Patent: May 21, 2024

(54) OPTOELECTRONIC SEMICONDUCTOR DEVICE AND METHOD FOR MANUFACTURING THE SAME

(71) Applicant: OSRAM Opto Semiconductors GmbH, Regensburg (DE)

(72) Inventor: Franz Eberhard, Kilchberg (CH)

(73) Assignee: OSRAM Opto Semiconductors GmbH, Regensburg (DE)

(*) Notice: Subject to any disclaimer, the term of this patent is extended or adjusted under 35 U.S.C. 154(b) by 414 days.

(21) Appl. No.: 17/422,207

(22) PCT Filed: Jan. 8, 2020

(86) PCT No.: PCT/EP2020/050293
§ 371 (c)(1),
(2) Date: Jul. 12, 2021

(87) PCT Pub. No.: WO2020/148121
PCT Pub. Date: Jul. 23, 2020

(65) Prior Publication Data
US 2022/0085263 A1 Mar. 17, 2022

(30) Foreign Application Priority Data
Jan. 14, 2019 (DE) .................... 10 2019 100 799.2

(51) Int. Cl.
*H01L 33/62* (2010.01)
*H01L 33/42* (2010.01)
(Continued)

(52) U.S. Cl.
CPC .............. *H01L 33/62* (2013.01); *H01L 33/42* (2013.01); *H01L 33/44* (2013.01); *H01L 33/32* (2013.01); *H01L 2933/0025* (2013.01)

(58) Field of Classification Search
CPC ...................................................... H01L 33/02
See application file for complete search history.

(56) References Cited

U.S. PATENT DOCUMENTS

2005/0087884 A1* 4/2005 Stokes .................. H01L 33/405
257/E33.068
2005/0139825 A1 6/2005 Song et al.
(Continued)

FOREIGN PATENT DOCUMENTS

DE 102005046190 A1 4/2007
DE 102010032834 A1 2/2012
(Continued)

OTHER PUBLICATIONS

International search report, issued for the corresponding PCT Application No. PCT/EP2020/050293, dated Mar. 23, 2020, 4 pages (For informational purposes only).
(Continued)

*Primary Examiner* — Yu-Hsi D Sun
(74) *Attorney, Agent, or Firm* — Viering, Jentschura & Partner mbB; Robert M Bilotta, Jr.

(57) ABSTRACT

An optoelectronic semiconductor device may include a first semiconductor layer and a second semiconductor layer, the first and second semiconductor layers being stacked one above the other. The device may include a first contact structure and a contact layer. The device may include a separating layer arranged over a side of the contact layer, and a current spreading layer arranged over a side of the separating layer facing away from the contact layer. The first contact structure may be connected to the contact layer via the current spreading layer and the separating layer. A layer stack may include the contact layer, the separating layer, and the current spreading layer has an anisotropic conductivity. The separating layer is present as a continuous layer in a region between the contact layer and the current spreading layer.

16 Claims, 7 Drawing Sheets

(51) Int. Cl.
    *H01L 33/44*    (2010.01)
    *H01L 33/32*    (2010.01)

(56)         References Cited

U.S. PATENT DOCUMENTS

2009/0262773 A1*  10/2009  Ahlstedt ............ H01L 31/1884
                                                          438/31
2012/0305061 A1   12/2012  O'Brien et al.
2014/0110865 A1    4/2014  Ng et al.
2015/0228874 A1    8/2015  Streitel et al.
2019/0027653 A1    1/2019  Eberhard
2019/0326471 A1   10/2019  Kopp et al.

FOREIGN PATENT DOCUMENTS

DE      102013101529  A1    3/2014
DE      102016101612  A1    8/2017
DE      102016112587  A1    1/2018
WO        2008082244  A1    7/2008

OTHER PUBLICATIONS

Search report issued for the corresponding German Patent Application No. 10 2019 100 799.2 dated Aug. 5, 2019, 6 pages (For informational purposes only).
Barranco et al.: "Perspectives on oblique angle depositions of thin films: From fundamentals to devices"; Progress in Materials Science 76; 2015; 95 pages; Published by Elsevier Ltd.
Office Action issued for the corresponding German patenapplication No. 11 2020 000 415.5, dated Feb. 29, 2024, 6 pages (for informational purposes only).

* cited by examiner

OPTOELECTRONIC SEMICONDUCTOR DEVICE AND METHOD FOR MANUFACTURING THE SAME

CROSS-REFERENCE TO RELATED APPLICATIONS

The present application is a national stage entry according to 35 U.S.C. § 371 of PCT Application No. PCT/EP2020/050293 filed on Jan. 8, 2020; which claims priority to German Patent Application Serial No. 10 2019 100 799.2 filed on Jan. 14, 2019; all of which are incorporated herein by reference in their entirety and for all purposes.

TECHNICAL FIELD

An optoelectronic semiconductor device having a separating layer that has a lower conductivity than a current spreading layer is specified.

BACKGROUND

A light emitting diode (LED) is a light emitting device based on semiconductor materials. For example, an LED includes a pn junction. When electrons and holes recombine with one another in the regions of the pn junction, due, for example, to a corresponding voltage being applied, electromagnetic radiation is generated.

In general, concepts are being sought by means of which a current supply to the semiconductor layers may be improved. Furthermore, concepts are being sought which allow for opto-electronic semiconductor devices to be manufactured at a lower cost.

One objective is to provide an improved opto-electronic semiconductor device and an improved method for manufacturing an optoelectronic semiconductor device.

SUMMARY

An optoelectronic semiconductor device comprises a first semiconductor layer of a first conductivity type and a second semiconductor layer of a second conductivity type, the first and second semiconductor layers being stacked on top of one another. The optoelectronic semiconductor device further comprises a first contact structure and a contact layer which is arranged over a side of the first semiconductor layer facing away from the second semiconductor layer and which is connected to the first semiconductor layer. The optoelectronic semiconductor device furthermore includes a separating layer which is arranged over a side of the contact layer facing away from the first semiconductor layer, and a current spreading layer which is arranged over a side of the separating layer facing away from the contact layer. The first contact structure is connected to the contact layer via the current spreading layer and the separating layer. A layer stack which includes the contact layer, the separating layer, and the current spreading layer has an anisotropic conductivity. The separating layer is present as a continuous layer in a region between the contact layer and the current spreading layer.

The separating layer may, for example, be an insulating layer having a layer thickness of less than 10 nm. In particular, a layer thickness of the separating layer may be within a range from 0.5 to 5 nm.

According to further embodiments, the separating layer may comprise a dielectric layer comprising a conductive additive.

Furthermore, the separating layer may comprise a dielectric layer of locally increased electrical conductivity.

According to further embodiments, an optoelectronic semiconductor device may comprise a first semiconductor layer of a first conductivity type and a second semiconductor layer of a second conductivity type, the first and second semiconductor layers being stacked on top of one another. The opto-electronic semiconductor device further comprises a first contact structure and a contact layer which is arranged over a side of the first semiconductor layer facing away from the second semiconductor layer and is connected to the first semiconductor layer. The optoelectronic semiconductor device furthermore includes a separating layer which is arranged over a side of the contact layer facing away from the first semiconductor layer, and a current spreading layer which is arranged over a side of the separating layer facing away from the contact layer. The first contact structure is connected to the contact layer via the current spreading layer and the separating layer. A layer stack which includes the contact layer, the separating layer, and the current spreading layer has an anisotropic conductivity. The separating layer comprises a conductive transparent oxide of a conductivity which is lower than the conductivity of the material as the current spreading layer.

According to embodiments, a resistivity of the separating layer may be greater than 10, 100 times or 1000 times the resistivity of the current spreading layer. A material of the separating layer may, for example, be selected from $TiO_2$ doped with metal atoms, $\beta\text{-}Ga_2O_3$, undoped or doped ZnO, undoped or doped $SnO_2$, NbO, MnO, MoO, or combinations of these materials.

According to further embodiments, an optoelectronic semiconductor device comprises a first semiconductor layer of a first conductivity type and a second semiconductor layer of a second conductivity type, the first and second semiconductor layers being stacked on top of one another. The opto-electronic semiconductor device further comprises a first contact structure and a contact layer which is arranged over a side of the first semiconductor layer facing away from the second semiconductor layer and which is connected to the first semiconductor layer. The optoelectronic semiconductor device furthermore includes a separating layer which is arranged over a side of the contact layer facing away from the first semiconductor layer, and a current spreading layer which is arranged over a side of the separating layer facing away from the contact layer. The first contact structure is connected to the contact layer via the current spreading layer and the separating layer. A layer stack which includes the contact layer, the separating layer, and the current spreading layer has an anisotropic conductivity. The separating layer comprises a dielectric layer, wherein a plurality of pores is arranged in the dielectric layer and the pores are at least partially filled with a conductive material.

For example, the pores may have a largest dimension which is smaller than 0.5 µm. A distance between the pores may be less than 10 µm, for example less than 1 µm.

A method for manufacturing an optoelectronic semiconductor device comprises forming a semiconductor layer stack comprising a first semiconductor layer of a first conductivity type and a second semiconductor layer of a second conductivity type, and forming a contact layer after forming the first semiconductor layer, the contact layer being connected to the first semiconductor layer. Moreover, the method comprises forming a separating layer after forming the contact layer and forming of a current spreading layer after forming the separating layer. A first contact structure is connected to the contact layer via the current spreading layer and the separating layer. A layer stack which includes the contact layer, the separating layer, and the current spreading layer has an anisotropic conductivity. The separating layer is present as a continuous layer in a region between the contact layer and the current spreading layer.

For example, forming the separating layer may include performing an ALD process to form a dielectric layer.

According to embodiments, the separating layer may be formed at a flat angle. For example, the separating layer may be formed using a GLAD ("glanzed angle deposition") process. For example, forming the separating layer may comprise forming a conductive transparent oxide of a conductivity which is lower than the conductivity of the material of the current spreading layer.

For example, the separating layer may be formed as a dielectric layer. Subsequently, a conductivity of the dielectric layer may be increased locally by means of laser irradiation.

According to all of the embodiments described herein, a layer thickness of the current spreading layer may be greater than a layer thickness of the contact layer. For example, the layer thickness of the contact layer may be 5 to 25 nm. The layer thickness of the current spreading layer may be 30 to 150 nm, for example.

BRIEF DESCRIPTION OF THE DRAWINGS

The accompanying drawings serve to provide an understanding of non-limiting embodiments. The drawings illustrate non-limiting embodiments and, together with the description, serve for explanation thereof. Further non-limiting embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1A:
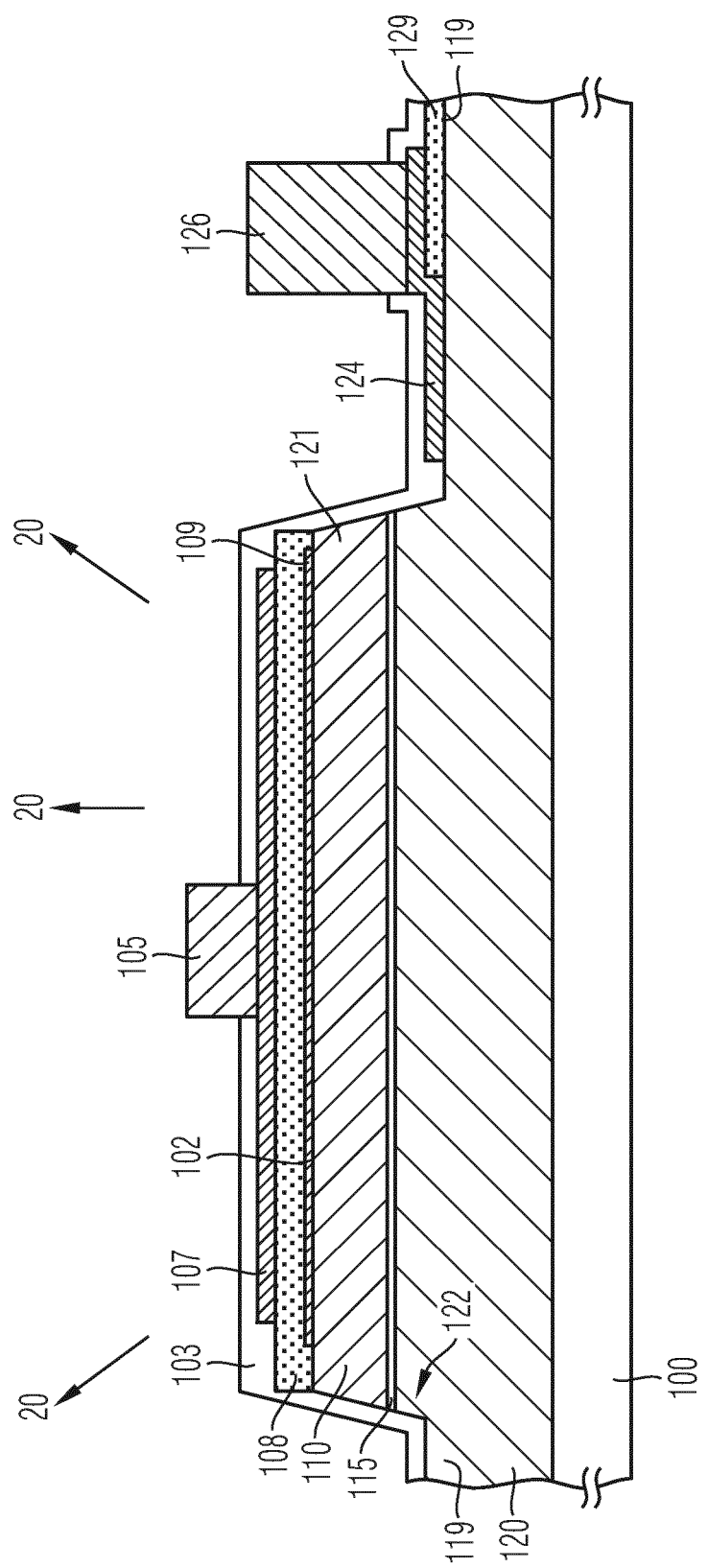
FIG. 1A shows a cross-sectional view of an optoelectronic semiconductor device according to embodiments.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Further examples of materials for growth substrates include glass, silicon dioxide, quartz or a ceramic.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the ternary compounds may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown.

The term "vertical", as used in this description, is intended to describe an orientation which is essentially perpendicular to the first surface of a substrate or semiconductor body. The vertical direction may correspond, for example, to a direction of growth when layers are grown.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

FIG. 1A shows a vertical cross-sectional view of an optoelectronic semiconductor device according to embodiments. The optoelectronic semiconductor device 10 shown in FIG. 1A may, for example, be a light emitting diode (LED). A first semiconductor layer 110 and a second semiconductor layer 120 are arranged over a suitable carrier 100. For example, the first semiconductor layer 110 may be doped to be of a first conductivity type, for example p-type, and the second semiconductor layer 120 may be of a second conductivity type, for example n-type. For example, the first and second semiconductor layers 110, 120 are based on a nitride compound semiconductor material. An active zone 115 may be arranged between the first semiconductor layer 110 and the second semiconductor layer 120.

The active zone may, for example, comprise a pn junction, a double heterostructure, a single quantum well structure (SQW, single quantum well) or a multiple quantum well structure (MQW, multi quantum well) for generating radiation. The term "quantum well structure" does not imply any particular meaning here with regard to the dimensionality of the quantization. Therefore it includes, among other things, quantum wells, quantum wires and quantum dots as well as any combination of these structures.

For example, the second semiconductor layer 120 may be arranged between the first semiconductor layer 110 and a suitable carrier 100. For example, the carrier 100 may be a growth substrate for the sequence of semiconductor layers. Suitable materials for the growth substrate or the carrier may include, for example, sapphire, silicon carbide or gallium nitride. A contact layer 109 made of an electrically conductive material may be arranged over the first semiconductor layer 110. For example, the contact layer 109 may be composed of a conductive oxide, a so-called "TCO" ("transparent conductive oxide"). Examples include in particular ITO (indium tin oxide), IZO (indium zinc oxide), or another transparent conductive material. The contact layer 109 may, for example, be directly adjacent to the first semiconductor layer 110.

A separating layer 108 is arranged on a side of the contact layer 109 facing away from the first semiconductor layer 110. A current spreading layer 107 is arranged over a side of the separating layer 108 facing away from the contact layer 109. The layer stack, which contains the contact layer 109, the separating layer 108, and the current spreading layer 107, has an anisotropic conductivity. For example, the resistivity of the layer stack is lower in a horizontal direction than in a vertical direction. According to embodiments, the layer stack may consist of the contact layer 109, the separating layer 108, and the current spreading layer. According to further embodiments, the layer stack may be delimited by the contact layer 109 and the separating layer 108. The layer stack thus has a greater transverse conductivity than vertical conductivity. This may be implemented, for example, by the separating layer 108 having a lower conductivity than the current spreading layer 107.

Specific implementations of the separating layer 108 will be described below with reference to FIGS. 1B and 2A to 2C. According to embodiments, the separating layer may be composed of one or more layers. According to embodiments, the separating layer 108 is present as a continuous layer in a region between the contact layer 109 and the current spreading layer 107. For example, in this region, no special via openings may be formed via which an electrical contact may be established between the contact layer 109 and the current spreading layer 107.

Furthermore, the optoelectronic semiconductor device 10 shown in FIG. 1A comprises a first contact structure 105. The first contact structure 105 is connected to the contact layer 109 via the current spreading layer 107 and the separating layer 108.

The current spreading layer 107 is made of a transparent conductive material, for example a conductive metal oxide such as ITO or IZO.

According to all of the embodiments described herein, a layer thickness of the current spreading layer 107 may be greater than a layer thickness of the contact layer 109. For example, the layer thickness of the contact layer 109 may be 5 to 25 nm. The layer thickness of the current spreading layer 107 may be 30 to 150 nm, for example.

In the optoelectronic semiconductor device shown in FIG. 1A, the functions of current spreading and electrical contact are separated from one another. More precisely, a thin contact layer 109 is arranged in contact with the first semiconductor layer 110 over the entire surface area or over a large part thereof. Because of its smaller layer thickness, the thin contact layer 109 is of reduced transverse conductivity. Conversely, less electromagnetic radiation is absorbed due to the smaller layer thickness. The thicker current spreading layer 107 causes improved transverse conductivity. Radiation losses may be reduced, for example, by means of the separating layer 108, as will be explained with reference to FIGS. 2A and 2B.

For example, the semiconductor layer stack may be patterned to form a mesa 121. Correspondingly, part of a first main surface 119 of the second semiconductor layer 120 may be exposed. A second electrical contact element 126 may, for example, contact the second semiconductor layer 120 in the region of an exposed first main surface 119. For example, the second contact element 126 may be connected to the second semiconductor layer 120 by means of a conductive material 124. An insulating material 129 may be arranged between the second contact element 126 and the underlying semiconductor material 120. For example, in the cross-sectional view of FIG. 1A, the part which is arranged to the left of the second contact element 126 may be continued on the right-hand side of the second contact element 126.

By applying a voltage between the first contact structure 105 and the second contact element 126, a current may be impressed into the optoelectronic semiconductor device. In this manner, emission of electromagnetic radiation 20, for example via a first main surface 102 of the first semiconductor layer 110, may be effected. In general, the more uniform this current, the higher the achievable light output.

The optoelectronic semiconductor device 10 may moreover comprise a passivation layer 103, which may be arranged, for example, over the current spreading layer 107. The passivation layer may, for example, also be arranged over the side walls 122 of the mesa 121 and may be arranged completely over the first main surface 102 of the first semiconductor layer 110 and over exposed regions of the second semiconductor layer 120. The passivation layer may be formed from a material having a lower refractive index than the current spreading layer 107. For example, the passivation layer may contain silicon oxide.

Figure 1B:
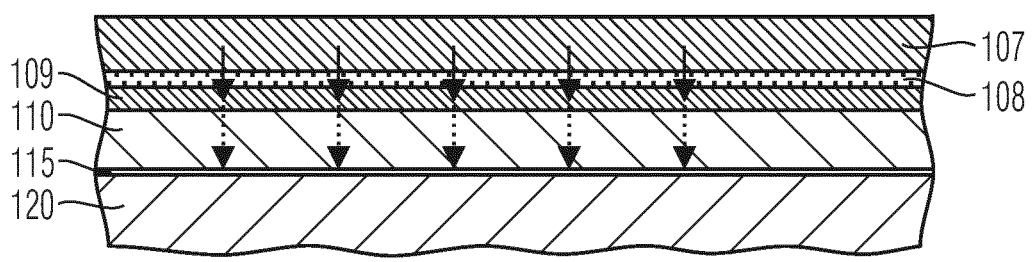
FIG. 1B shows an enlarged cross-sectional view of a region of the optoelectronic semiconductor device.

According to embodiments, the separating layer 108 may be implemented to be of lower conductivity than the current spreading layer by means of a very thin insulating layer. FIG. 1B shows a schematic cross-sectional view of the layer stack composed of contact layer 109, separating layer 108, and current spreading layer 107. For example, the separating layer 108 may be only a few monolayers thick. Possible materials of the separating layer include, for example, $Al_2O_3$, $SiO_2$, $Si_3N_4$, $TiO_2$, TaO, $Nb_2O_5$ or combinations of these materials, wherein the stoichiometric ratios may differ from those specified. For example, in this case the separating layer may have a layer thickness of less than 10 nm. For example, the insulating layer may have a layer thickness greater than 0.5 nm. According to embodiments, this separating layer 108 may be deposited by an ALD ("atomic layer deposition") process. The thickness may be set very precisely even with very thin layers. Furthermore, any surface roughness over the contact layer 109 may easily be overmolded. As a result, a uniformly insulating layer 108 or a separating layer 108 which is uniformly less conductive in the vertical direction is provided. For example, charge carriers may tunnel through the thin insulating layer 108. As a result, the separating layer 108 has a lower conductivity than the contact layer 109 and the current spreading layer 107. Correspondingly, the layer stack composed of contact layer 109, separating layer 108, and current spreading layer 107 has an anisotropic conductivity, i.e., a significantly greater transverse conductivity than vertical conductivity.

According to further embodiments, the separating layer 108 may be embodied such that, in addition to the electrical property of low conductivity, it also has an optical function. The main goal here is to reduce absorption, essentially by total reflection of flat rays in the separating layer. Another goal is to increase transmission in a relevant angular range. This may be implemented, for example, by the separating layer 108 having a minimum layer thickness and a refractive index which is adapted, for example, to the refractive index of the passivation layer 103. For example, a minimum layer thickness of the separating layer may be 20 nm. The separating layer 108 may comprise several individual layers of different refractive indices and layer thicknesses.

Figure 2A:
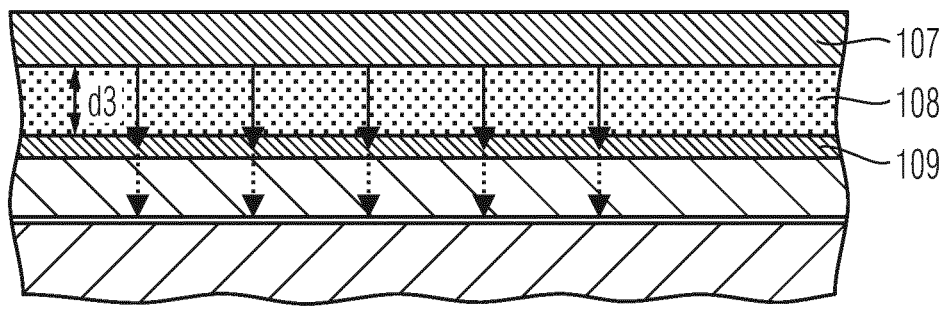
FIG. 2A shows a schematic cross-sectional view of a region of an optoelectronic semiconductor device according to embodiments.

FIG. 2A shows a cross-sectional view through the layer stack composed of contact layer 109, separating layer 108, and current spreading layer 107 according to further embodiments. As shown in FIG. 2A, in this case, the separating layer 108 has a minimum thickness $d_3$ of 20 to 800 nm, for example. The separating layer may, for example, comprise a conductive transparent oxide of a conductivity which is lower than the conductivity of the current spreading layer 107, i.e., for example, indium-tin oxide. Furthermore, in this case, the material of the separating layer may have a lower absorption capacity than the current spreading layer 107 and the contact layer 109. For example, the separating layer may contain $TiO_2$ doped with metal atoms. For example, the $TiO_2$ may be doped with niobium. According to further embodiments, the separating layer 108 may contain β-$Ga_2O_3$, undoped or doped ZnO, undoped or doped $SnO_2$, NbO, MnO or MoO.

According to embodiments, in these cases, the refractive index or the refractive index profile may be adapted or reduced by deposition at flat angles (oblique angle deposition or glanzing angle deposition (GLAD)). As a result, the total internal reflection of flat rays may be accomplished in an improved manner. In this process, the surface of a workpiece over which the layer is to be deposited is arranged at a certain angle with respect to the direction of incidence of the material to be grown. As a result, the material may be introduced, for example, at a flat angle of less than 45° with respect to the horizontal surface of the semiconductor layers. With such a geometry, for example, shadowing effects may occur due to areas that have been grown on. As a result, a layer is not deposited continuously but in columns. Defects or pores may be formed between adjacent columns. As a result, the deposited layer has a lower refractive index than the bulk material. This type of separating layer 108 will be shown in more detail below with reference to FIG. 2B.

Alternatively, the separating layer 108 may be constructed from a dielectric, insulating material in which defects or pores are formed. The dielectric, insulating material may contain, for example, silicon nitride, silicon oxide, silicon oxynitride, aluminum oxide, titanium oxide, tantalum oxide, niobium oxide, or combinations of these materials. The pores are partially filled with a conductive material, for example a transparent conductive oxide. For example, only some of the pores, for example pores of a certain minimum diameter, may be filled with conductive material. For example, pores may not be filled completely. For example, ITO may be used as the conductive material, which is deposited using an ALD process. According to further embodiments, doped or undoped $SnO_2$ may be used, which is deposited using a CVD process, for example. Subsequently, for example, the current spreading layer 107 may be deposited using an ALD process also or using a PVD ("physical vapor deposition") process also.

For example, the pores may have a largest horizontal dimension smaller than 0.5 μm. A distance between the pores may, for example, be less than 10 μm, for example less than 1 μm.

According to further embodiments, the separating layer 108 may comprise a dielectric layer, for example as mentioned above, with a conductive additive.

Figure 2B:
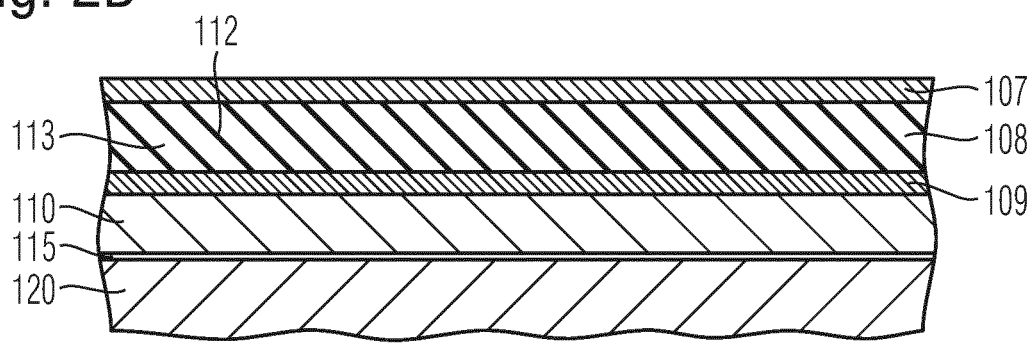
FIG. 2B shows a schematic cross-sectional view of a region of an optoelectronic semiconductor device according to embodiments.

FIG. 2B shows a cross-sectional view of the layer stack composed of contact layer 109, separating layer 108, and current spreading layer 107 over a semiconductor body which comprises the first semiconductor layer and the second semiconductor layer. In this case, the separating layer 108 is deposited by deposition at a flat angle. In FIG. 2B the columnar structures 113 which result from this type of deposition are shown and separated from one another by defects or pores 112.

This results in a reduced optical refractive index for the separating layer compared to a separating layer without columnar structures 113. As a consequence, the separating layer 108 may be suitable for reflecting electromagnetic radiation 20 emitted by the semiconductor layer stack, which would be output at flat angles, back into the semiconductor layer stack.

According to further embodiments, it is possible to increase the conductivity of the separating layer 108 locally.

Figure 2C:
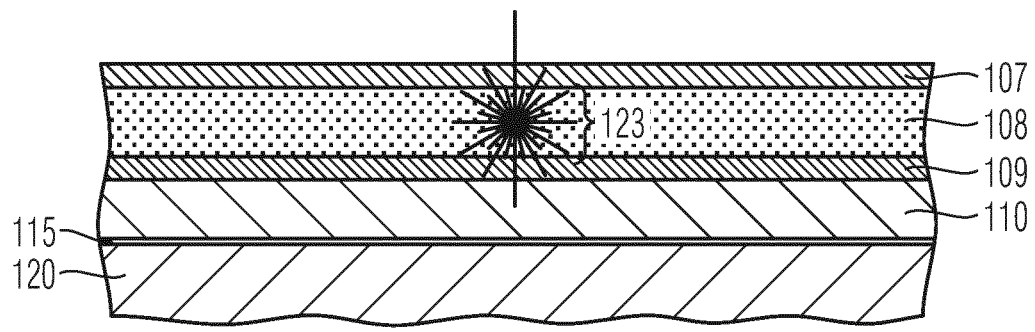
FIG. 2C shows a schematic cross-sectional view of a region of an optoelectronic semiconductor device.

FIG. 2C shows a schematic cross-sectional view of the layer stack composed of contact layer 109, separating layer 108, and current spreading layer 107. According to FIG. 2C, the conductivity of the separating layer 108 is increased locally in the region 123. For example, this aftertreatment may include local laser irradiation. As a result, part of the current spreading or contact layer may, for example, diffuse into the separating layer 108 and may lead to a local current path there. According to further embodiments, if a material of the separating layer 108 comprises a transparent conductive oxide, for example, the material of the separating layer may be locally healed, as a result of which the conductivity is increased. Furthermore, the material of the separating layer 108 may be modified by the local treatment. For example, the stoichiometry of the material of the separating layer 108 may be modified locally.

As has been described, the special configuration of the separating layer provides for a separating layer of a high but defined resistance. As a result, the layer stack composed of contact layer 109, separating layer 108, and current spreading layer 107 has a high conductivity in the lateral direction. Furthermore, the layer stack has a limited conductivity in the vertical direction. In this manner, it is possible to prevent what is known as current crowding in the region of the contact structure 105. More precisely, due to the presence of the separating layer, the current is spread over a larger horizontal region and is not concentrated within the region that is directly adjacent to the first contact structure 105. As a result, a current impression and thus light emission may be homogenized. As the separating layer 108 possesses finite conductivity in the vertical direction, an electrical contact between the current spreading layer 107 and the contact layer 109 may be effected without increased technological effort. In addition, it is possible for the separating layer 108 to perform an optical function, as has been described.

Figure 3A:
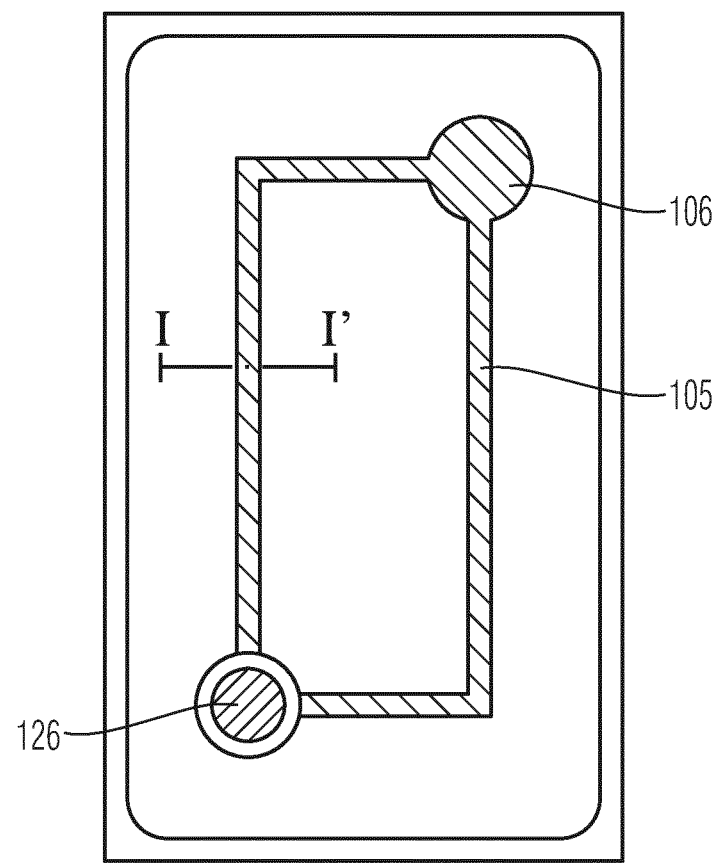
FIG. 3A shows a schematic layout of an optoelectronic semiconductor device according to embodiments.

FIG. 3A shows a schematic layout of an optoelectronic semiconductor device 10 according to embodiments. In this case, the first contact structure 105 is formed as a contact finger, for example. The contact finger may be rectangular, annular or curved. However, any other configuration of this contact finger is possible. For example, it may be formed in a comb shape or similar to the veining of a leaf. Furthermore, the first contact structure 105 may comprise a plurality of contact fingers, which may be identical or different from one another. The first contact structure 105 may be electrically connected via a first contact element 106. Furthermore, the optoelectronic semiconductor device 10 comprises a second contact element 126.

According to embodiments shown in FIG. 3A, for example, a first contact structure 105 for electrically contacting the first semiconductor layer 110 and a second contact structure (not shown in FIG. 3A) may be formed one above the other in the vertical direction. This will be explained in more detail with reference to FIG. 3B. The second contact element 126 may, for example, be arranged at a corner position of the rectangle, diagonally opposite the first contact element 106. For example, the second semiconductor layer may be contacted at a location which is surrounded on both sides by the first semiconductor layer 110.

Figure 3B:
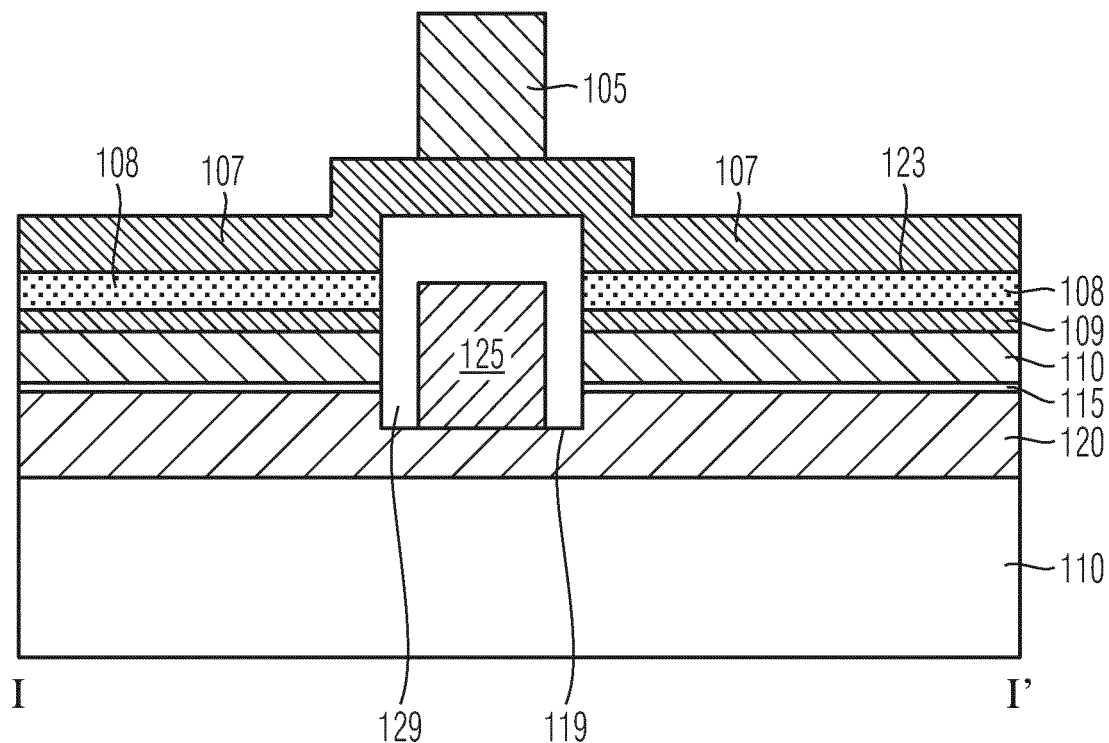
FIG. 3B shows a cross-sectional view of the optoelectronic semiconductor device according to embodiments.

FIG. 3B shows a schematic cross-sectional view of the opto-electronic semiconductor device between I and I', as indicated in FIG. 3A. The second semiconductor layer 120 and the first semiconductor layer 110 and, if applicable, the active zone 115 are arranged over the carrier 100. Parts of the first semiconductor layer 110 and the active zone 115 are removed in places, so that part of the first surface 119 of the second semiconductor layer 120 is exposed. A second contact structure 125 is arranged in this region. Parts of the first and second semiconductor layers 110, 120 are each arranged on both sides of the second contact structure 125. The second contact structure 125 is enclosed on three sides by an insulating material 129, for example, so that the second contact structure 125 is electrically insulated from the adjacent current spreading layer 107 and the adjacent first semiconductor layer 110. For example, the second contact structure 125 contains a metal. The first contact structure 105 may be arranged over the second contact structure 125 in the vertical direction. In this manner, absorption losses of the emitted electromagnetic radiation may be reduced by the contact structures. The first semiconductor layer 110 is electrically connected to the current spreading layer 107 and the first contact structure 105 via the contact layer 109, the separating layer 108.

Figure 3C:
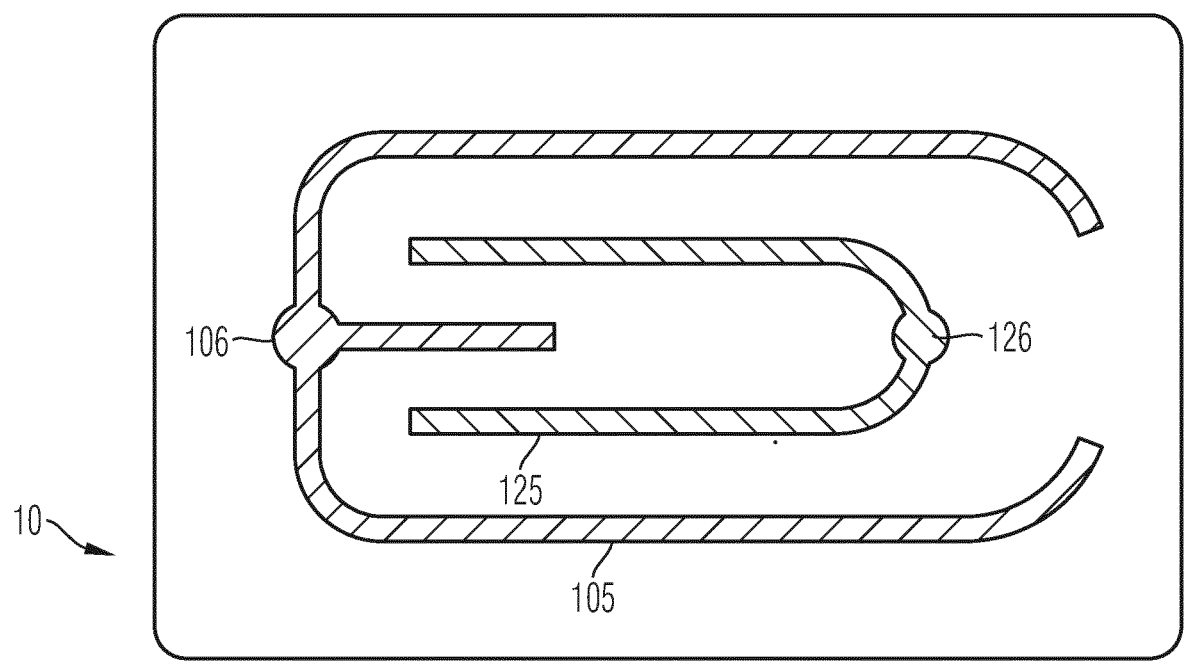
FIG. 3C shows a schematic layout of an optoelectronic semiconductor device according to further embodiments.

FIG. 3C shows a schematic layout of part of an optoelectronic semiconductor device according to further embodiments. As shown in FIG. 3C, the first contact structure 105 and the second contact structure 125 may also be embodied in spatially separated regions, with the semiconductor layer stack composed of the first semiconductor layer 110 and the second semiconductor layer 120 being patterned to form a mesa, for example. In this case, part of the first main surface 119 of the second semiconductor layer 120 is exposed, as also shown in Figure TA. As shown in FIG. 3C, the first contact structure 105 may be electrically connected via a first contact element 106, for example. The second contact structure 125 may be electrically connected via a second contact element 126.

Figure 4:
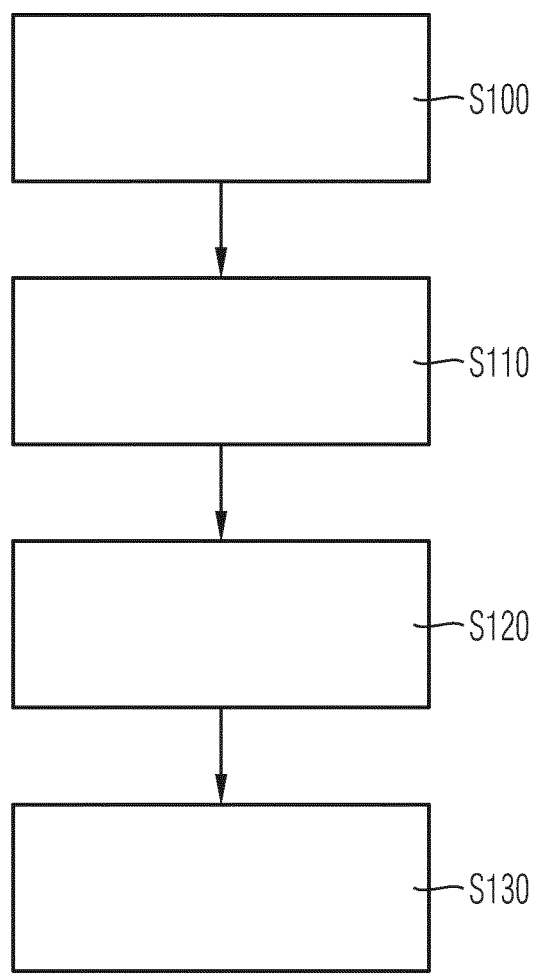
FIG. 4 outlines a method according to embodiments.

FIG. 4 illustrates a method for manufacturing an optoelectronic semiconductor device. The method includes forming (S100) a semiconductor layer stack comprising a first semiconductor layer of a first conductivity type and a second semiconductor layer of a second conductivity type. The method further comprises forming (S110) a contact layer after forming the first semiconductor layer, the contact layer being connected to the first semiconductor layer. The method further comprises forming a separating layer (S120) after forming the contact layer and forming (S130) a current spreading layer after forming (S120) the separating layer. A first contact structure is connected to the contact layer via the current spreading layer and the separating layer. Furthermore, a layer stack which includes the contact layer, the separating layer, and the current spreading layer has an anisotropic conductivity. The separating layer (108) is present as a continuous layer in a region between the contact layer (109) and the current spreading layer (107).

For example, forming the separating layer may include performing an ALD process to form a dielectric layer. For example, the dielectric layer may be formed to have a layer thickness of 0.5 to 5 nm.

As has been described, by using the method described, a more homogeneous electrical contact with the first semiconductor layer may be effected without, for example, requiring technologically complex processes, for example for defining contact holes in the separating layer. Accordingly, the manufacturing process for the optoelectronic semiconductor device may be simplified.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

LIST OF REFERENCES 10 optoelectronic semiconductor device
15 optoelectronic semiconductor device
20 emitted electromagnetic radiation
25 optoelectronic apparatus
100 carrier
102 first main surface of the first semiconductor layer
103 passivation layer
105 first contact structure
106 first contact element
107 current spreading layer
108 separating layer
109 contact layer
110 first semiconductor layer
112 pore
113 columnar structure 115 active zone
119 first main surface of the second semiconductor layer
120 second semiconductor layer
121 mesa
122 sidewall of the mesa
123 region of increased conductivity
124 conductive material
125 second contact structure
126 second contact element
129 insulating material

The invention claimed is:

1. An optoelectronic semiconductor device comprising:
a first semiconductor layer of a first conductivity type;
a second semiconductor layer of a second conductivity type, the first and second semiconductor layers being stacked one on top of the other;
a first contact structure;
a contact layer arranged over a side of the first semiconductor layer facing away from the second semiconductor layer and connected to the first semiconductor layer;
a separating layer arranged over a side of the contact layer facing away from the first semiconductor layer; and
a current spreading layer arranged over a side of the separating layer facing away from the contact layer;
wherein the first contact structure is connected to the contact layer (109) via the current spreading layer and the separating layer;
the separating layer is present as a continuous layer in a region between the contact layer and the current spreading layer and the separating layer has a lower conductivity than the current spreading layer; and
a layer stack comprising the contact layer, the separating layer, and the current spreading layer has an anisotropic conductivity.

2. The optoelectronic semiconductor device according to claim 1, wherein the separating layer is an insulating layer having a layer thickness of less than 10 nm.

3. The optoelectronic semiconductor device according to claim 2, wherein a layer thickness of the separating layer ranges from 0.5 to 5 nm.

4. The optoelectronic semiconductor device according to claim 1, wherein no via openings are formed in the separating layer.

5. The optoelectronic semiconductor device according to claim 1, wherein the separating layer comprises a dielectric layer including a conductive additive.

6. The optoelectronic semiconductor device according to claim 1, wherein the separating layer comprises a dielectric layer of locally increased electrical conductivity.

7. An optoelectronic semiconductor device comprising:
a first semiconductor layer of a first conductivity type;
a second semiconductor layer of a second conductivity type, the first and second semiconductor layers being stacked one on top of the other;
a first contact structure;
a contact layer arranged over a side of the first semiconductor layer facing away from the second semiconductor layer and connected to the first semiconductor layer;
a separating layer arranged over a side of the contact layer facing away from the first semiconductor layer; and
a current spreading layer arranged over a side of the separating layer facing away from the contact layer;
the first contact structure being connected to the contact layer via the current spreading layer and the separating layer;
a layer stack comprising the contact layer, the separating layer, and the current spreading layer has an anisotropic conductivity; and
the separating layer comprises a conductive transparent oxide; wherein the separating layer has a lower conductivity than the current spreading layer.

8. The optoelectronic semiconductor device according to claim 7, wherein a material of the separating layer is selected from $TiO_2$ doped with metal atoms, $\beta$-$Ga_2O_3$, undoped or doped ZnO, undoped or doped $SnO_2$, NbO, MnO, MoO, or combinations thereof.

9. The optoelectronic semiconductor device according to claim 7, wherein a resistivity of the separating layer is greater than 100 times the resistivity of the current spreading layer.

10. The optoelectronic semiconductor device according to claim 9, wherein a resistivity of the separating layer is greater than 1000 times the resistivity of the current spreading layer.

11. An optoelectronic semiconductor device comprising:
a first semiconductor layer of a first conductivity type;
a second semiconductor layer of a second conductivity type, the first and second semiconductor layers being stacked one on top of the other;
a first contact structure;
a contact layer arranged over a side of the first semiconductor layer facing away from the second semiconductor layer and connected to the first semiconductor layer;
a separating layer arranged over a side of the contact layer facing away from the first semiconductor layer; and
a current spreading layer arranged over a side of the separating layer facing away from the contact layer;
wherein the first contact structure is connected to the contact layer via the current spreading layer and the separating layer;
the separating layer comprises a dielectric layer, wherein a plurality of pores is arranged in the dielectric layer and the pores are at least partially filled with a conductive material; and
a layer stack comprising the contact layer, the separating layer, and the current spreading layer has an anisotropic conductivity.

12. The optoelectronic semiconductor device according to claim 11, wherein all dimensions of the pores are smaller than 0.5 μm.

13. The optoelectronic semiconductor device according to claim 11, in which wherein the pores are spaced apart at a distance of less than 10 μm.

14. The optoelectronic semiconductor device according to claim 11, wherein a layer thickness of the current spreading layer is greater than the layer thickness of the contact layer.

15. The optoelectronic semiconductor device according to claim 11, wherein the layer thickness of the contact layer ranges from 5 to 25 nm.

16. The optoelectronic semiconductor device according to claim 11, wherein the layer thickness of the current spreading layer ranges from 30 to 150 nm.

* * * * *